United States Patent [19]

Hacke et al.

[11] Patent Number: 5,043,296
[45] Date of Patent: Aug. 27, 1991

[54] METHOD OF MANUFACTURING LED ROWS USING A TEMPORARY RIGID AUXILIARY CARRIER

[75] Inventors: Hans-Jurgen Hacke; Manfred Maier, both of Munich; Gregor Unger; Oscar Wirbser, both of Germering, all of Fed. Rep. of Germany

[73] Assignee: Siemens Aktiengesellschaft, Munich, Fed. Rep. of Germany

[21] Appl. No.: 466,305
[22] PCT Filed: Mar. 15, 1988
[86] PCT No.: PCT/DE89/00163
§ 371 Date: Apr. 2, 1990
§ 102(e) Date: Apr. 2, 1990
[87] PCT Pub. No.: WO89/08927
PCT Pub. Date: Sep. 21, 1989

[30] Foreign Application Priority Data

Mar. 15, 1988 [DE] Fed. Rep. of Germany ....... 3808667

[51] Int. Cl.$^5$ ...................... H01L 21/68; H01L 21/58
[52] U.S. Cl. ....................... 437/51; 437/205; 437/906
[58] Field of Search ............. 437/51, 906, 205, 209; 340/782; 354/5; 355/211

[56] References Cited

U.S. PATENT DOCUMENTS

| 3,658,618 | 4/1972 | Gramann | 437/205 |
| 3,708,851 | 1/1973 | Vladik | 29/281.1 |
| 4,305,097 | 12/1981 | Doemens et al. | 358/101 |
| 4,432,131 | 2/1984 | Sadamassa et al. | 437/906 |

FOREIGN PATENT DOCUMENTS

| 0125632 | 5/1984 | European Pat. Off. . |
| 0150882A1 | 1/1985 | European Pat. Off. . |
| 1805174 | 5/1970 | Fed. Rep. of Germany . |
| 3009985 | 9/1981 | Fed. Rep. of Germany . |
| 3447452A1 | 7/1985 | Fed. Rep. of Germany . |
| 3534338A1 | 4/1987 | Fed. Rep. of Germany . |
| 57-207076 | 12/1982 | Japan . |
| 2156153A | 10/1985 | United Kingdom . |

OTHER PUBLICATIONS

"Water Soluble Blister Packaging for Electrical Components", by E. G. Crosby, et al., IBM Technical Disclosure Bulletin, vol. 16, No. 6, Nov. 1973, p. 1749.
"High-Accuracy Die-Bonding Technology for LED Array", by Hiroshi Tanabe, et al., IEEE Transactions of Components, Hybrids & Manufacturing Technology, Dec., 1985, No. 4, New York, pp. 500–504.

Primary Examiner—Olik Chaudhuri
Assistant Examiner—David E. Graybill
Attorney, Agent, or Firm—Hill, Van Santen, Steadman & Simpson

[57] ABSTRACT

An assembly process for strip-shaped LED chips (112) in a row on a solid metal carrier (M) is to be specified. The observation of strictest tolerances in all three directions, i.e. in view of division spacing, trueness to line and surface planarity, is thereby required. On the other hand, an optimum thermal coupling to the metal carrier (M) is required for the illumination of the high dissipated heat from the LEDs (113) of a LED chip (112). The LED chips (112) are applied on to the metal carrier (M) in a transfer process. To that end, the LEDs have their faces glued onto an auxiliary carrier (H1) positioned with high precision and the LED row (114) prefabricated in this fashion is then soldered onto the previously solder-coated metal carrier (M). The auxiliary carrier (H1) is subsequently removed.

18 Claims, 2 Drawing Sheets

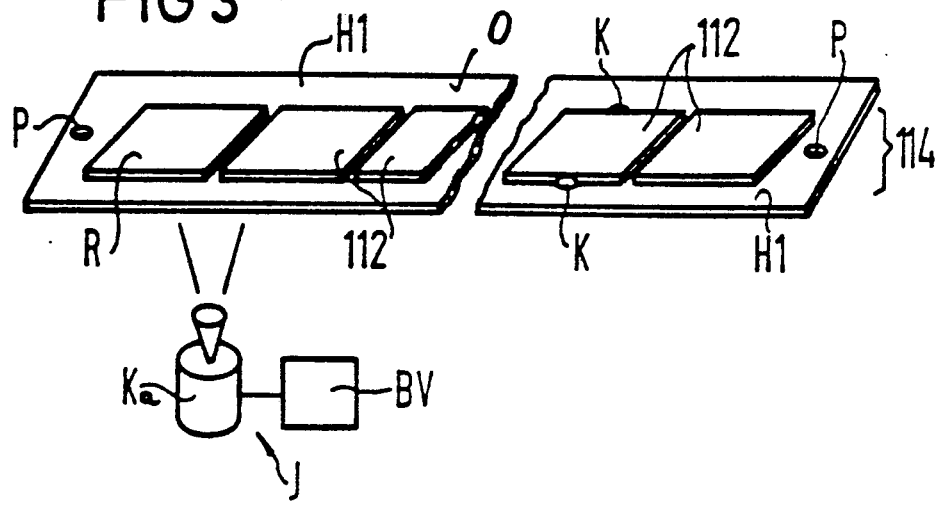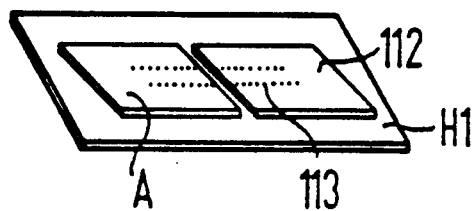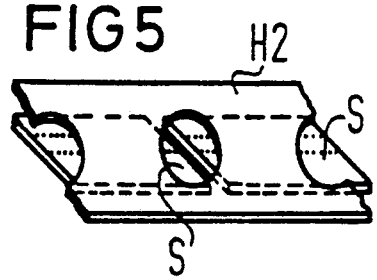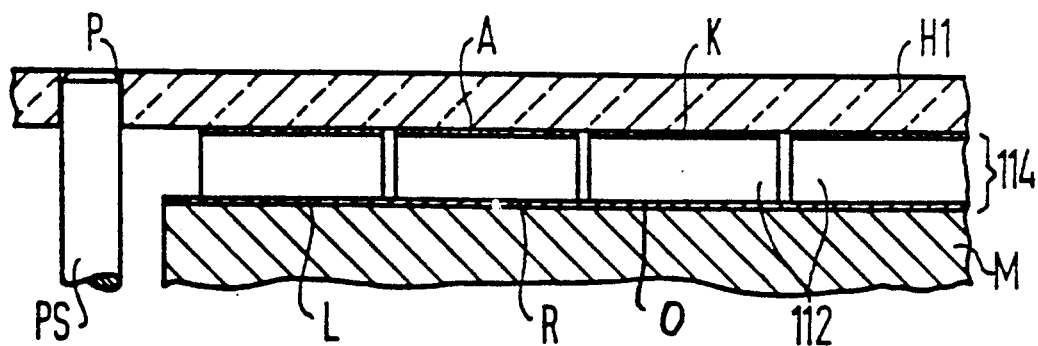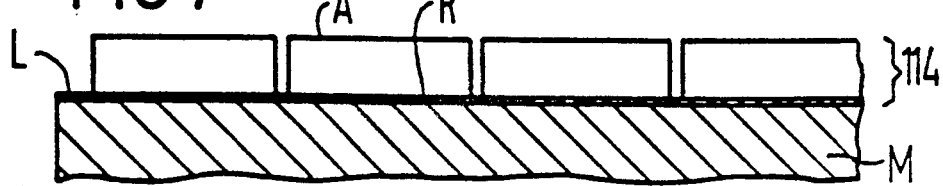

METHOD OF MANUFACTURING LED ROWS USING A TEMPORARY RIGID AUXILIARY CARRIER

BACKGROUND OF THE INVENTION

The invention is directed to an assembly process for producing LED rows, particularly for the character generator of a non-mechanical printer.

What is usually meant by LED rows is the arrangement of LEDs, i.e. of light-emitting diodes in row form. Originally, discrete individual components were assembled to form rows. A coarse grid of, for example, 1/10, 1/20 inches of completely encapsulated LEDs could only be realized therewith. Later, individually unencapsulated LED chips were assembled to form rows; significantly finer grids could be realized therewith. At present, integration on the semiconductor wafer makes it possible to arrange LEDs with an extremely high dot density, for example, 300 or 600 dpi (dots per inch).

Due to limitations in the semiconductor wafer size and for reasons of yield, it is only possible to manufacture smaller strip sections of LED rows integrated in such fashion. In order to manufacture long LED rows, for example, for printing purposes, a plurality of such sections must be assembled fitting very exactly to one another.

LEDs are usually employed for display purposes. DE-A 35 34 338, for example, also already discloses, however, to employ LEDs for printing purposes in a character generator for a non-mechanical printer. The character generator disclosed therein contains a plurality of light sources fashioned, for example, as light-emitting diodes in an illumination row. A latent, electrostatic image is produced on a transfer-printing drum upon employment of the light sources. In the known character generator, all of the components that form the illumination row such as the light-emitting diodes, the drive circuits and leads, are firmly mounted on a shared carrier, whereby the fastening of the light-emitting diodes and drive circuits is undertaken by gluing. The carrier thereby has a length that is at least as great as the width of the entire illumination row.

In character generators, the employment of LEDs as imaging elements requires that the strictest tolerances be observed in all three directions given the high dot density of up to 600 dpi, i.e. with respect to division spacing, trueness to line and surface planarity. On the other hand, an optimum, thermal coupling to a carrier composed of metal is required for eliminating the high dissipated heat from the LEDs. These demands, however, cannot be met without further ado in the manufacturing methods up to now. On the basis of a preceding adjustment, the gluing of LED chips onto a carrier in fact enables the required observation of strictest tolerances in all three directions; the glue, however, prevents the optimum thermal coupling required for eliminating the dissipated heat. On the other hand, a soldering of the LED chips to a metal carrier enables an optimum thermal coupling; when soldering a LED chip, however, the softening or re-melting of the soldered connection of the neighboring LED chip necessarily leads to the de-adjustment thereof.

SUMMARY OF THE INVENTION

The object of the invention is to create an assembly process for producing LED rows that, first, enables the observation of strictest tolerances in view of division spacing, trueness to line and surface planarity and, second, guarantees an elimination of the high dissipated heat from the LEDs on the basis of an optimum thermal coupling to a metal carrier.

In an assembly process of the species, this object is achieved by the method steps as follows:

(a) LED chips having at least one LED have their active side positioned in line form on a planar surface of an auxiliary carrier, are adjusted relative to one another and are releasably joined to the auxiliary carrier using a glue;

(b) an LED row of the LED chips secured to the auxiliary carrier is positioned with backsides of the LED chips on a metal carrier;

(c) the backsides of the LED chips are connected to the metal carrier by soldering; and (d) the auxiliary carrier and the glue are removed.

In the assembly process of the invention, in other words, the LEDs are applied onto the metal carrier via a transfer process. This transfer process enables, first, that the LEDs can be applied onto the auxiliary carrier in line-fashion with high precision in all three directions and, that, second a connection to the metal carrier that has good thermal conductivity is guaranteed by the soldering. It is thereby possible to also compensate relatively great differences in the thickness of the LEDs without these differences in thickness being noticeable as steps on the row surface.

Advantageous embodiments and improvements of the invention follow.

BRIEF DESCRIPTION OF THE DRAWINGS

Exemplary embodiments of the invention are shown in the drawing and shall be set forth in greater detail below.

Shown are:

FIG. 3 the application of LED chips onto an auxiliary carrier in the row form required for the illumination module of FIG. 2;

FIG. 4 the joining region of two LED chips arranged on the auxiliary carrier of FIG. 3;

FIG. 5 the joining region of two LED chips arranged on a second embodiment of the auxiliary carrier;

FIG. 6 the transfer of the LED chips arranged on the auxiliary carrier in row form onto a metal carrier; and FIG. 7 the finished arrangement of the LED row required for the illumination module of FIG. 2 on the metal carrier.

DESCRIPTION OF THE PREFERRED EMBODIMENT

Figure 1:
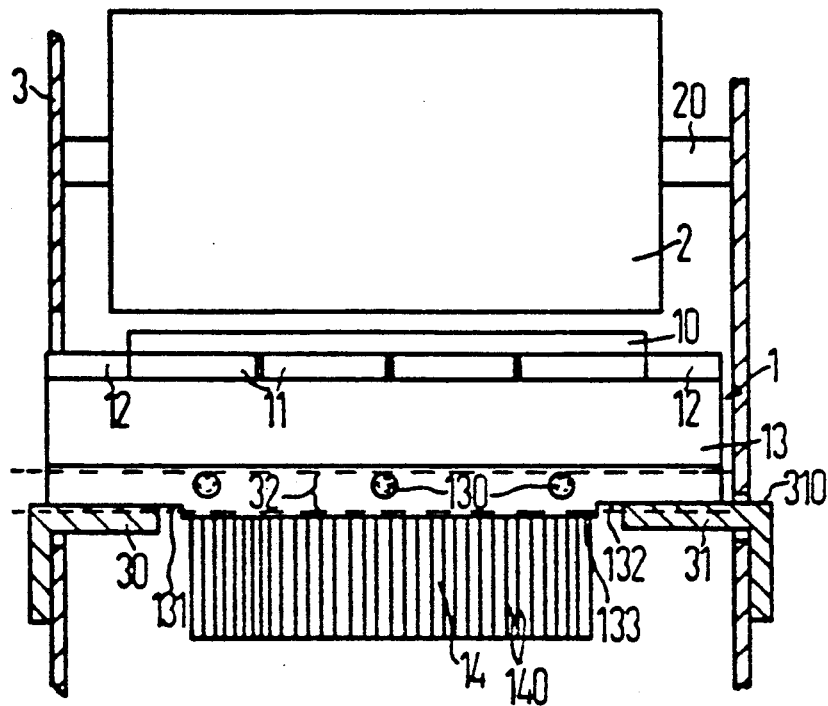
FIG. 1 a fundamental sub-structure of an electrophotographic printer for generating a latent, electrostatic image, shown in cross-section.

FIG. 1 shows how a character generator 1 and a transfer-printing drum 2 are integrated in a printer housing 3 of a printer. The transfer-printing drum 2 is axially fixed on a spindle 20 seated rotatably in the printer housing for this purpose. The character generator 1 is secured in the printer housing 3 under the rotatably seated transfer-printing drum 2. To that end, the character generator 1 has its two ends rigidly mounted on adjustable fastening elements 30, 31.

An imaging optics 10 of the character generator 1 reproduces picture elements of light-emitting diodes (referred to as LEDs below) on the transfer-printing drum 2. These LEDs are respectively arranged on an illumination module 11 that is positively locked to the web of a module carrier 13 fashioned T-shaped. Detent elements 12 that prevent a displacement of the illumination modules 11 in horizontal direction in the operating condition of the character generator 1 are also provided on the web of the module carrier 13. The flange of the module carrier 13 fashioned T-shaped also comprises running rollers 130 that are secured in respective pairs diametrically opposite one another at the two long face sides of the flange. Over and above this, the base area of the flange is divided into two seating surfaces 131, 132 as well as into a step surface 133 offset from these two seating surfaces 131, 132 on which a plurality of cooling ribs 140 forming a cooling member 14 are secured, for example, soldered.

For operation of the printer, the character generator is introduced into the printer housing 3 until the character generator 1 has its seating surfaces 131, 132 seated on the fastening elements 30, 31 in the fastening planes 300, 310, being inserted thereinto in that the running rollers 130 are moveable in horizontal direction in guide rails 32 of the printer housing 3.

Figure 2:
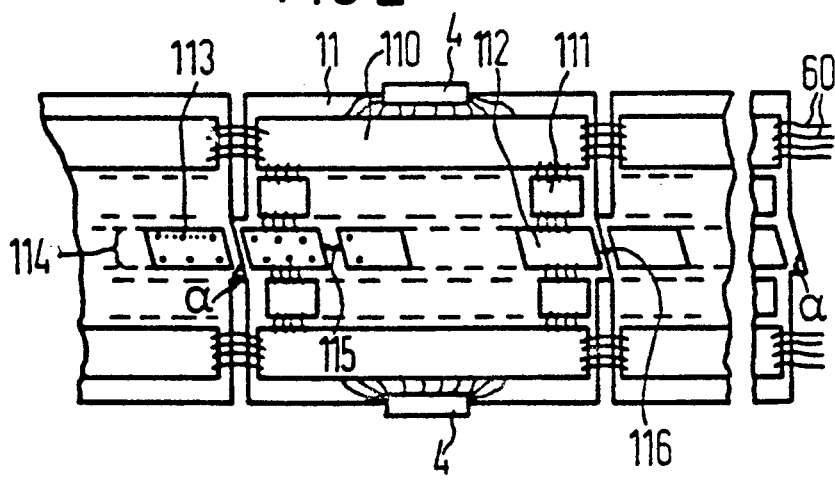
FIG. 2 the plan view onto an illumination module comprising LED row of the printer of FIG. 1.

In order to generate latent, electrostatic images on the transfer-printing drum 2 with the character generator 1, and in order, ultimately, to be able to thereby print arbitrary characters on a recording medium, the LEDs 113 as LED chips 112 having sides parallel in pairs and containing 64 or 128 LEDs dependent on the printing grid are, as shown in FIG. 2, monolithically integrated on the illumination modules 11 in a regular spacing in a LED row or, respectively, illumination line 114. Representative of this, LEDs are entered as dots in FIG. 2. The individual LEDs in the illumination row 114 or, respectively, on the LED chips 112 are arranged respectively offset in two rows that proceed with equidistant spacing. This offset is defined dependent on the printing grid. Printing grids that are typically employed are 240 dpi (dots per inch), 300 dpi and 600 dpi. The offset of the LEDs 113 is required because, among other things, the diameter of the LEDs 113 for the said printing grid is larger than the offset resulting therefrom and the LEDs 113 can therefore not be arranged in a single-row, continuous illumination line 114. Moreover, the number 64 or, respectively, 128 for the plurality of LEDs 113 per LED chip 112 on the modules 11 of the character generator 1 is not arbitrarily selected, but is based on conditions that are related to the digital drive of the LEDs 113. As may be seen in FIG. 2, an integrated circuit 111 is provided for this digital drive for every LED row of an LED chip 112 on the module 11. Each of these integrated circuits 111 is connected via a bus system 110 both to a flexible ribbon line 4 as well as to data and control lines 60 via driver modules (not shown) and, thus, is connected to a power supply or, respectively, to a micro-processor control means (neither shown). All printing data of the LEDs 113 in the illumination row 114 are stored and edited in this means.

In view of the afore-mentioned offset between the LEDs 113 of the upper row and the LEDs 113 of the lower row, the LED chips 112 are beveled by angles of $\alpha = 76°$ in the region of their abutting surfaces, as may be seen in FIG. 2. Corresponding to the module division, the blank from which the individual illumination modules 11 are fabricated is parted with particular care at the angle $\alpha$ in the region of the illumination line 114 and is subsequently mechanically processed with extreme tolerance precision. This is required so that the joining surfaces 116 arising due to the mechanical processing do not have a disadvantageous influence on the homogeneity of the overall illumination line 114 across all illumination modules of the character generator 1 when the modules 11 are braced in horizontal direction. On the other hand, preventing these joining surfaces 116 from having a disadvantage influence on the homogeneity is only established by an adequately large joining gap 115 between the individual chips 112 on every module 11.

The problem underlying the manufacture of LED rows 114 is solved in that the LEDs are soldered for optimum thermal coupling and in that the LEDs are transferred onto the metal carrier in a transfer process in order to observe the strict tolerances, particularly in the height deviation. With their active side down, the LEDs are thereby first glued in a row on a planar auxiliary carrier upon employment of high-precision optical adjustment means. This auxiliary carrier together with the LED row is then positioned on the solid metal carrier coated with solder and previously defined in strip-shape, being positioned thereon such that the solderable backside of the LEDs points toward the solder on the metal carrier. The fixed composite of metal carrier and auxiliary carrier is then put in place on a heat source, for example, on a vapor phase soldering system. The solder on the metal carrier thereby melts, moistens the LED backsides and produces the connections. After soldering, the auxiliary carrier is removed by dissolving the glue. After a cleaning process, the metal carrier now provided with an LED row is ready for further processing.

The essential steps of the procedure set forth above when applying the LED chips 112 in line form onto the metal carrier M of the illumination module 11 shown in FIG. 2 shall be set forth in detail below with references to FIGS. 3–7.

According to FIG. 3, a rigid auxiliary carrier H1 is employed that, for example, has a thickness of 1 mm and is composed of transparent glass. Positioning openings P whose function shall be explained later in conjunction with FIG. 6 are situated at both ends of the strip-shaped auxiliary carrier H1. The individual LED chips successively have their active side positioned on the planar surface O of the auxiliary carrier H1 and are fixed by gluing, i.e. the solderable backsides R of the LED chips 112 point up. The application ensues in such fashion that a first LED chip 112 is first positioned on the surface O of the auxiliary carrier H1 and is then fixed with the assistance of an ultraviolet-hardenable glue K, whereupon the second LED chip 112 is positioned on the surface O, is adjusted relative to the first LED chip 112 and is fixed with the assistance of the ultraviolet-hardenable glue K. This procedure is continued until the last LED chip 112 is fixed on the auxiliary carrier H. The adjustment of the LED chips 112 ensues with the assistance of an opto-electronic adjustment means J that is composed of a camera Ka arranged under the auxiliary carrier H1 and of an image processing means BV. For example, the functioning of such opto-electronic adjustment means J is disclosed in U.S. Pat. No. 4,305,097, hereby incorporated by reference. The fixing of the adjusted LED chips 112 by gluing is shown in FIG. 3 at the penultimate LED chip 112 of the LED row 114. The ultraviolet-hardenable glue K is applied in drop form at both sides of an LED chip 112 to be fixed such that it is automatically drawn in between the active side A of the LED chip 112 and the surface O of the auxiliary carrier H1 by capillary action and can be hardened immediately thereafter with ultraviolet radiation from below through the auxiliary carrier H1.

During the adjustment event, the camera Ka respectively acquires the joining region of two LED chips 112 and the LEDs 113 on the active side A in this joining region through the transparent auxiliary carrier H1, as may be seen in FIG. 4. During the actual adjustment event, the LED chip 112 that is not yet fixed is aligned relative to the preceding LED chip 112 that is already glued, being aligned, for example, by double image comparison and such that no interruption in the joining region appears in the two rows of the LEDs 113.

According to the modification shown in FIG. 5, an auxiliary carrier reference H2 therein can also be composed of metal such as, for example, stainless steel or of ceramic when it is provided with viewing openings S for the adjustment of the LED chips 112 in the joining region of the LED chips 112.

FIG. 6 shows the transfer of the LED row 114 releasably secured on the auxiliary carrier H1 onto the metal carrier M of the illumination module 11 (See FIG. 2). The positioning of the auxiliary carrier H1 relative to the metal carrier M ensues with the assistance of a means of which only the positioning pins PS penetrating into the positioning openings P can be seen. The metal carrier M that has a thickness of 12 mm is composed of copper for thermic reasons, this being provided with a gold layer (not shown in the drawing) that is about 1.5 μm thick and is electro-deposited in the intended joining region to the LED chips 112. A thin solder layer L that, for example, involves a tin/lead solder is situated on the gold layer. The solder layer L arranged strip-like on the metal carrier M in the joining region is first applied in the form of a solder paste with silk screening and is then remelted. The solderable backsides R of the LED chips 112 lie on the solder layer L, whereby a gold layer (not visible in the drawing) that is vapor-deposited onto the backside R in a vacuum serves as solderable layer.

As already mentioned, the composite of metal carrier M and auxiliary carrier H1 shown in FIG. 6 is heated in a vapor phase soldering system until the solder L melts and guarantees a reliable solder connection between the backsides R of the LED chips 112 and the metal carrier M. Solder L that may potentially emerge at the sides when soldering can be collected in grooves of the metal carrier M that, for example, are 1 mm deep and that are not shown in the drawing.

After the soldering, the auxiliary carrier H1 and the glue K employed are removed, so that the finished LED row 114 shown in FIG. 7 is now arranged on the metal carrier M, whereby the active sides A are directed up. The removal of the auxiliary carrier H1 ensues in an especially simple way by dissolving the glue K in a suitable solvent. For example, ethyl methyl ketone is suitable as solvent for commercially available ultraviolet-hardenable glues that, for example, comprise ultraviolet hardener on the basis of hydroxylalkylphenons.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. Assembly process for producing LED rows, particularly for a character generator of a non-mechanical printer, comprising the steps of:
    (a) adjusting relative to one another and releasably joining to a rigid auxiliary carrier (H1; H2) by using a glue (K) LED chips (112) having at least one LED (113) which have their active side (A) positioned in line form on a planar surface (O) of the rigid auxiliary carrier (H1; H2);
    (b) positioning an LED row (114) of the LED chips (112) secured to the rigid auxiliary carrier (H1; H2) with backsides (R) of the LED chips (112) on a metal carrier (M);
    (c) connecting the backsides (R) of the LED chips (112) to the metal carrier (M) by soldering; and
    (d) removing the rigid auxiliary carrier (H1; H2) and the glue (K).

2. Assembly process according to claim 1, wherein an auxiliary carrier (H1) composed of glass is employed.

3. Assembly process according to claim 1, wherein an auxiliary carrier (H2) of metal or ceramic is used that is provided with viewing openings (S) in the joining region of the LED chips (112) for the adjustment of the LED chips (112).

4. Assembly process according to claim 1, wherein the positioning of the LED chips (112) is undertaken with the assistance of an opto-electronic adjustment means (J).

5. Assembly process according to claim 1, wherein an LED chip is individually positioned on the auxiliary carrier (H1, H2), is adjusted and is fixed by application of the glue (K) and following hardening of the glue (K) for a previously positioned LED chip.

6. Assembly process according to claim 5, wherein an ultraviolet-hardenable glue (K) is employed and is hardened with ultraviolet radiation respectively before the positioning of the next LED chip (112).

7. Assembly process according to claim 1, wherein the glue (K) is applied in drop form such that it is automatically drawn in between the active side (A) of an LED chip (112) and the surface (O) of the auxiliary carrier (H1) due to capillary action.

8. Assembly process according to claim 1, wherein for the metal carrier (M) a metal carrier (M) coated in stripe-fashion with solder (L) in the joining region is employed.

9. Assembly process according to claim 8, wherein after the positioning of the auxiliary carrier (H1) with the LED chips (112) on the metal carrier (M), the entire arrangement is heated until the solder (L) melts.

10. Assembly process according to claim 1, wherein the auxiliary carrier (H1; H2) is removed after the soldering by dissolving the glue (H).

11. Assembly process for producing LED rows, comprising the steps of:
    (a) providing a rigid auxiliary carrier composed of glass and adjusting relative to one another and releasably joining to the rigid auxiliary carrier by using a glue LED chips having at least one LED which have their active side positioned in line form on a planar surface of the rigid auxiliary carrier;
    (b) positioning an LED row of the LED chips secured to the rigid auxiliary carrier with backsides of the LED chips on a metal carrier;

(c) connecting the backsides of the LED chips to the metal carrier by soldering; and (d) removing the rigid auxiliary carrier and the glue.

12. Assembly process according to claim 11, wherein the positioning of the LED chips is undertaken with the assistance of an opto-electronic adjustment means.

13. Assembly process according to claim 11, wherein an LED chip is individually positioned on the rigid auxiliary carrier, is adjusted and is fixed by application of the glue and following hardening of the glue for a previously positioned LED chip.

14. Assembly process according to claim 13, wherein an ultraviolet-hardenable glue is employed and is hardened with ultraviolet radiation respectively before the positioning of the next LED chip.

15. Assembly process according to claim 11, wherein the glue is applied in drop form such that it is automatically drawn in between the active side of an LED chip and the surface of the rigid auxiliary carrier due to capillary action.

16. Assembly process according to claim 11, wherein for the metal carrier a metal carrier coated in stripe-fashion with solder in the joining region is employed.

17. Assembly process according to claim 17, wherein after the positioning of the rigid auxiliary carrier with the LED chips on the metal carrier, the entire arrangement is heated until the solder melts.

18. Assembly process according to claim 11, wherein the rigid auxiliary carrier is removed after the soldering by dissolving the glue.

* * * * *